United States Patent [19]
Wilcox

[11] Patent Number: 5,365,118
[45] Date of Patent: Nov. 15, 1994

[54] CIRCUIT FOR DRIVING TWO POWER MOSFETS IN A HALF-BRIDGE CONFIGURATION

[75] Inventor: Milton E. Wilcox, Saratoga, Calif.

[73] Assignee: Linear Technology Corp., Milpitas, Calif.

[21] Appl. No.: 893,523

[22] Filed: Jun. 4, 1992

[51] Int. Cl.$^5$ ............................................. H03K 17/56
[52] U.S. Cl. ..................................... 327/109; 327/390; 327/427
[58] Field of Search ............... 307/571, 572, 491, 575, 307/577, 578, 584, 254, 592

[56] References Cited

U.S. PATENT DOCUMENTS

| | | | |
|---|---|---|---|
| 4,527,081 | 7/1985 | Stewart | 307/571 |
| 4,954,729 | 9/1990 | Urai | 307/572 |
| 5,099,138 | 3/1992 | Fukunaga | 307/571 |
| 5,214,322 | 5/1993 | Neldorff et al. | 307/571 |

OTHER PUBLICATIONS

"Si9975/Si9976 N-Channel Half-Bridge Driver," Advance Information Data Sheet published by Siliconix, Santa Clara, Calif., pp. 5–83, in 1990/1991 Power Products Data Book.
"Si9976DY N-Channel Half-Bridge Driver", Advance Information Data Sheet published by Siliconix, dated Feb. 14, 1992, Santa Clara, Calif., pp. 55–59.

Primary Examiner—Timothy P. Callahan
Assistant Examiner—Shawn Riley
Attorney, Agent, or Firm—Laurence S. Rogers; Mark D. Rowland; Robert W. Morris

[57] ABSTRACT

A driver circuit for driving top and bottom power transistors stacked between two supply terminals is provided. The driver circuit includes shoot-through reduction means for monitoring the gate-to-source voltages of the two power transistors so as to inhibit the turning-ON of each power transistor until the gate-to-source voltage of the other power transistor has fallen to a voltage level indicative of the other transistor being OFF. Additionally, the driver circuit which can utilize a bootstrap capacitor for providing enhanced voltages to drive the top power transistor, also includes a bootstrap capacitor recharge means to monitor the output voltage of the circuit so as to inhibit the turning-ON of the top power transistor until the bootstrap capacitor has had sufficient time to recharge.

22 Claims, 9 Drawing Sheets

TABLE

| OPERATIONAL STATE | INPUT TERM. $V_{IN}$ | MONITORED VOLTAGES | | DRIVE CONDITIONS | | COMMENTS |
|---|---|---|---|---|---|---|
| | | $V_{BG}$ | $V_{TG}-V_{TS}$ | $I_B$ | $I_T$ | |
| A | LOW | MAXIMUM | MINIMUM | >0 | ≈0 | Bottom MOSFET on, TOP MOSFET off |
| B | HIGH | >$(V_{BG})$Thr | ✕ | [-] | ≈0 | Input switched high, Bottom MOSFET gate discharging |
| C | HIGH | <$(V_{BG})$Thr | ✕ | [-] | [+] | Bottom MOSFET turned off, Bottom MOSFET gate charging |
| D | HIGH | MINIMUM | MAXIMUM | ≈0 | >0 | Bottom MOSFET off, Top MOSFET on |
| E | LOW | ✕ | >$(V_{TG}-V_{TS})$Thr | ≈0 | [-] | Input switched low, Top MOSFET gate discharging |
| F | LOW | ✕ | <$(V_{TG}-V_{TS})$Thr | [+] | [-] | Top MOSFET turned off, Bottom MOSFET gate charging |

= DON'T CARE

TABLE

| OPERATIONAL STATE | INPUT TERM. | MONITORED VOLTAGES | | | DRIVE CONDITIONS | | COMMENTS |
|---|---|---|---|---|---|---|---|
| | $V_{IN}$ | $V_{TS}$ | $V_{BG}$ | $V_{TG}-V_{TS}$ | $I_B$ | $I_T$ | |
| I | HIGH | MAXIMUM | X | X | ≈0 | >0 | Bottom MOSFET off, TOP MOSFET on |
| J | LOW | >$(V_{TS})_{RC}$ | X | X | ≈0 | [-] | Input switched low, Top MOSFET gate discharging |
| K | HIGH | >$(V_{TS})_{RC}$ | X | X | [+] | [-] | Input switched high before $V_{TS}<(V_{TS})_{RC}$. Input high command ignored. |
| L | HIGH | <$(V_{TS})_{RC}$ | X | X | [-] | [+] | $V_{TS}<(V_{TS})_{Thr}$. Input high command allowed. Bottom MOSFET gate discharging. |

= DON'T CARE

TABLE

| OPERATIONAL STATE | INPUT TERM. $V_{IN}$ | MONITORED VOLTAGES | | | DRIVE CONDITIONS | | COMMENTS |
|---|---|---|---|---|---|---|---|
| | | $V_{TS}$ | $V_{BG}$ | $V_{TG}-V_{TS}$ | $I_B$ | $I_T$ | |
| M | LOW | MINIMUM | MAXIMUM | MINIMUM | >0 | ≈0 | Bottom MOSFET on, TOP MOSFET off |
| N | HIGH | ✕ | $>(V_{BG})Thr$ | ✕ | (−) | ≈0 | Input switched high, Bottom MOSFET gate discharging |
| O | HIGH | ✕ | $<(V_{BG})Thr$ | ✕ | (−) | (+) | Bottom MOSFET turned off, Top MOSFET gate charging |
| P | HIGH | MAXIMUM | MINIMUM | MAXIMUM | ≈0 | >0 | Bottom MOSFET off, TOP MOSFET on |
| Q | LOW | $>(V_{TS})RC$ | ✕ | $>(V_{TG}-V_{TS})Thr$ | ≈0 | (−) | Input switched low, Top MOSFET gate discharging |
| R | HIGH | $>(V_{TS})RC$ | ✕ | $>(V_{TG}-V_{TS})Thr$ | ≈0 | (−) | Input switched high before $V_{TS}<(V_{TS})RC$. Input high command ignored. |
| S | HIGH | $>(V_{TS})RC$ | ✕ | $<(V_{TG}-V_{TS})Thr$ | (+) | (−) | Top MOSFET off cycle continues with Top MOSFET off and Bottom MOSFET gate charging |
| T | HIGH | $<(V_{TS})RC$ | $>(V_{BG})Thr$ | ✕ | (−) | ≈0 | $V_{TS}<(V_{TS})RC$. Input high command allowed. Bottom MOSFET gate discharging |

= DON'T CARE

CIRCUIT FOR DRIVING TWO POWER MOSFETS IN A HALF-BRIDGE CONFIGURATION

BACKGROUND OF THE INVENTION

The present invention relates to a driver circuit. More particularly, the present invention relates to a half-bridge driver circuit.

Electronic circuit output stages which employ two power transistors stacked in series between two supply rails (i.e., in a so-called "half-bridge" or "totem-pole" configuration) require a driver circuit to drive the two power transistors out of phase. Such output stages are commonly used, for example, to pulse width modulate inductive loads in motor control and switching regulator applications.

Driver circuits for the above and other applications must satisfy various requirements. First, the driver circuit must ensure that both power transistors are not ON simultaneously. Otherwise, a low impedance path may exist between supply rails, giving rise to undesirable "shoot-through," or "cross-conduction," current. Shoot-through current can cause a reduction in power efficiency since it represents supply current which has bypassed the load. Additionally, in a worst case, shoot through can cause power transistor failure due to current overloading. Therefore, a driver circuit should desirably minimize the amount of time and amount of current that both power transistors conduct simultaneously.

Second, a driver circuit must provide sufficient bias voltages to both power transistors. In other words, a driver circuit must provide large enough drive voltages to the drive terminals of both power transistors so that they are capable of operating under their respective optimum bias conditions. Otherwise, power dissipation in the power transistors may increase, giving rise to a reduction in power efficiency of the overall output circuit. Therefore, power transistors in driver circuits should spend minimal time operating under non-optimum bias conditions.

In view of the foregoing, it would be desirable to provide a driver circuit capable of driving two power transistors stacked between two supply rails without the problems associated with shoot through or cross-conduction currents.

It would also be desireable to provide such a circuit without the problems associated with driving the power transistors under non-optimum bias conditions.

SUMMARY OF THE INVENTION

It is therefore an object of the present invention to provide a driver circuit for driving two power transistors stacked between two supply rails without the problems associated with shoot through or cross-conduction currents.

It is also an object of the present invention to provide such a circuit without the problems associated with driving the transistors under non-optimum bias conditions.

In accordance with these and other objects of the invention, there is provided a driver circuit for driving top and bottom power transistors stacked in series between two supply rails.

The circuit includes means for driving the power transistors from a single input, and monitoring the gate-to-source voltages of the two power transistors so as to inhibit the turning-ON of each power transistor until the gate-to-source voltage of the other power transistor has fallen to a predetermined level indicative of the other transistor being OFF. Thus, shoot-through or cross-conduction currents are reduced in the driver circuit of the present invention.

Additionally, the driver circuit of the present invention which can utilize a bootstrap capacitor for providing enhanced voltages to drive the top power transistor, also includes a means to monitor the output voltage of the circuit so as to inhibit the turning-ON of the top power transistor until the bootstrap capacitor has had sufficient time to recharge. Thus, the top power transistor will be driven under optimal bias conditions when turned ON. If desired, this feature of the present invention can be incorporated into a driver circuit that also reduces shoot-through or cross-conduction currents, as discussed above.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
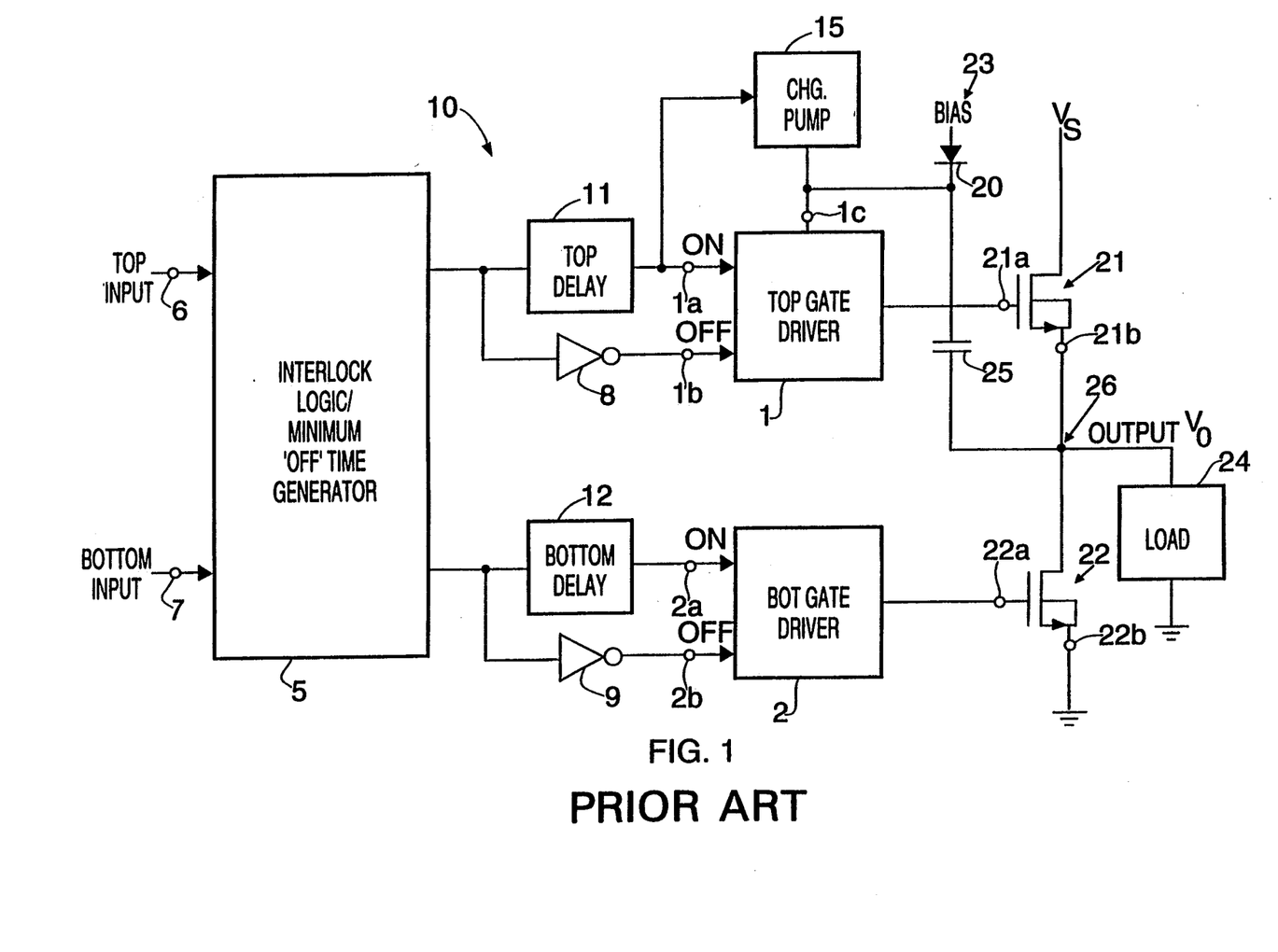
FIG. 1 is a schematic block diagram of a typical prior art half-bridge driver circuit.

FIG. 1 is a schematic block diagram of a typical prior art half-bridge driver circuit.

As shown in FIG. 1, circuit 10 is used to drive two power MOSFETS 21 and 22 stacked in series between supply rail $V_S$ and ground. Circuit 10 is typically referred to as a "half-bridge" or "totem-pole" configuration. MOSFETS 21 and 22 are used to alternately supply current to load 24 coupled to output terminal 26. Load 24, for example, may be a motor in a motor control circuit or an inductor in a switching regulator circuit.

Typically, power MOSFETS 21 and 22 are alternately driven by two separate drivers (top gate driver 1 and bottom gate driver 2) controlled by two separate input signals (top input signal 6 and bottom input signal 7). Terminals 1a and 2a of driver 1 and driver 2, respectively, are used to turn the drivers ON. Terminals 1b and 2b of driver 1 and driver 2, which are coupled to the outputs of inverters 8 and 9, respectively, are used to turn the drivers OFF.

Input signals 6 and 7 are usually conditioned using some form of interlock logic, provided by interlock logic circuit 5, intended to prevent power MOSFETS 21 and 22 from being turned on simultaneously. Delays are sometimes added, by way of top delay circuit 11 and bottom delay circuit 12, to further prevent simultaneous conduction during switching.

An additional feature of typical prior art driver circuits is that the drive to top power MOSFET 21 is supplied from bootstrap capacitor 25. This capacitor, coupled between output voltage node 26 and top side driver supply terminal 1c, provides a boosted voltage at supply terminal 1c for driving top MOSFET 21 at enhanced voltage levels. Bias supply 23, which is typically connected to a 10 to 15 volt supply, is isolated from top side driver supply terminal 1c by diode 20 when the voltage at terminal 1c exceeds the bias supply voltage.

For optimum performance bootstrap capacitor 25 must not be allowed to discharge under duty cycle extremes (e.g., when MOSFET 21 is continually kept on for long periods of time). Therefore a minimum "off" time is usually generated for top power MOSFET 21 by way of interlock logic circuit 5 to allow bootstrap capacitor 25 to be recharged while top power MOSFET 21 is off. An optional charge pump circuit 15 is sometimes used to allow power MOSFET 21 to be turned on continuously without the need for a minimum "off" time.

One disadvantage of circuit 10 in FIG. 1 is that under certain conditions both power MOSFETS 21 and 22 can turn on and conduct simultaneously. This could occur, for example, if the signal applied to gate drivers 1 or 2 is not delayed sufficiently to allow the other power transistor to have turned OFF. When both power transistors conduct simultaneously, a low impedance path exists between supply rail $V_S$ and ground, resulting in undesirable shoot-through or cross-conduction currents.

In prior art circuits such as FIG. 1, shoot-through is attempted to be prevented typically by introducing additional fixed delay times between the drive signals to the two power MOSFET drivers (e.g., top delay 11 and bottom delay 12 in FIG. 1). While this technique may work adequately for a given set of power transistors, changing to larger power MOSFETs often means having to modify the delay times to prevent shoot-through. Additionally, a change in the supply rail voltage $V_S$ or temperature may also cause shoot-through to occur if enough safety margin is not provided.

An additional disadvantage of prior art circuit 10 is that the drive to top MOSFET 21 requires special consideration. N-channel power MOSFETs are typically turned on by taking gate terminals 21a and 22a five to fifteen volts above their source terminals 21b and 22b, respectively. Since source 22b of bottom power MOSFET 22 (i.e., the "low-side" MOSFET) is at low potential (i.e., ground in FIG. 1), this allows gate 22a drive from bottom gate driver circuit 2 to be easily supplied by the high supply rail.

In contrast, source 21b of top power MOSFET 21 (i.e., the "high-side" MOSFET) is at the output potential, which must swing up to the high supply rail. This means that gate 21a of top power MOSFET 21 must swing above the high supply rail an additional five to fifteen volts. Gate drive above the high supply rail is typically generated dynamically by charging bootstrap capacitor 25 while bottom power MOSFET 22 is turned on, and then using the charge to power the top gate driver 1 when top power MOSFET 21 is to be turned on. However, if the input duty cycle does not allow top power MOSFET 21 to periodically turn off for a long enough time, bootstrap capacitor 25 may discharge, leading to a reduction in gate drive and increase in dissipation in top power MOSFET 21. This is generally prevented by introducing circuitry contained in top gate driver 1 which periodically interrupts the drive to top power MOSFET 21 so as to recharge bootstrap capacitor 25. If D.C. operation of top power MOSFET 21 is required, then charge pump 15 must be used.

Figure 2:
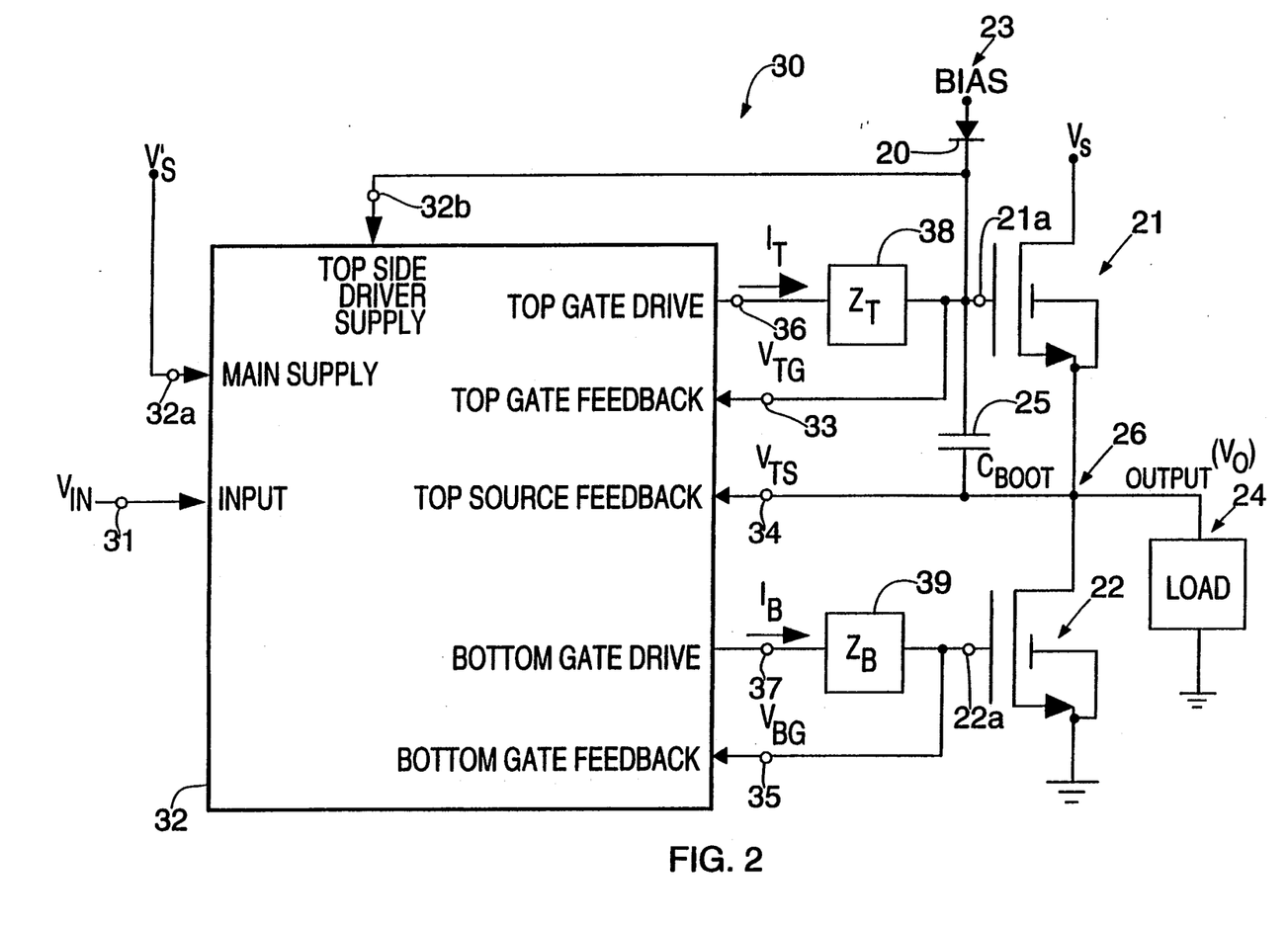
FIG. 2 is a schematic block diagram of an exemplary half-bridge driver circuit incorporating principles of the present invention.

FIG. 2 is a schematic block diagram of an exemplary half-bridge driver circuit incorporating principles of the present invention.

Circuit 30 drives two power MOSFETS 21 and 22 utilizing a single logic INPUT 31. Logic circuit 32, which is powered through main supply 32a, is used to monitor MOSFETS 21 and 22 through three voltage feedback terminals: top gate feedback terminal 33, top source feedback terminal 34 and bottom gate feedback terminal 35. Based upon the voltages which are detected at feedback terminals 33–35, logic circuit 32 controls the turning ON and turning OFF of MOSFETS 21 and 22 through top gate drive terminal 36 and bottom gate drive terminal 37, respectively.

Optional networks 38 and 39 couple the drive signals from drive terminals 36 and 37 to gates 21a and 22a of MOSFETS 21 and 22, respectively. For example, optional networks 38 and 39 could be resistors for providing controlled turn-on and turn-off times.

Logic circuit 32 includes top side driver supply terminal 32b which is coupled to the high side of bootstrap capacitor ($C_{BOOT}$) 25 for providing enhanced drive to gate 21a of top MOSFET 21.

Voltage feedback terminals 33–35 of logic circuit 32 respectively monitor top MOSFET 21 gate voltage ($V_{TG}$), top MOSFET 21 source voltage ($V_{TS}$) and bottom MOSFET 22 gate voltage ($V_{BG}$). In accordance with one feature of the present invention, these monitored voltages are used to prevent top MOSFET 21 and bottom MOSFET 22 from conducting at the same time (i.e., to prevent "shoot-through") as follows.

When INPUT terminal 31 is LOW, drive to gate 22a of bottom MOSFET 22 (through bottom gate drive terminal 37) is provided by logic circuit 32 only when the gate-to-source voltage of top MOSFET 21 ($V_{TG}-V_{TS}$) is below a predetermined threshold value $[(V_{TG}-V_{TS})_{THR}]$, which is typically set at a voltage value where current conduction through the top MOSFET is insignificant (e.g., approximately at the intrinsic threshold voltage of the top MOSFET). Because the drive to bottom MOSFET 22 is inhibited until top MOSFET 21 is substantially turned OFF and conducts an insignificant amount of current from its drain (supply rail $V_S$) to its source, logic circuit 32 reduces or prevents the occurrence of shoot-through due to premature turn-on of bottom MOSFET 22 prior to turn-off of top MOSFET 21.

Similarly, when INPUT terminal 31 is HIGH, drive to gate 21a of top MOSFET 21 (through top gate drive terminal 36) is provided only when the gate to source voltage of bottom MOSFET 21 ($V_{BG}$) is below a second predetermined threshold value [$(V_{BG})_{THR}$], which is typically set at a voltage value where current conduction through the bottom MOSFET is insignificant (e.g., approximately at the intrinsic threshold voltage of the bottom MOSFET). Because the drive to top MOSFET 21 is inhibited until bottom MOSFET 22 is substantially turned OFF and conducts an insignificant amount of current from its drain to its source (ground), logic circuit 32 also reduces or prevents the occurrence of shoot-through due to premature turn-on of top MOSFET 21 prior to turn-off of bottom MOSFET 22.

Because the drive to the previously-OFF MOSFET is not turned ON until the other previously-ON MOSFET is substantially turned OFF, logic circuit 32 reduces or prevents the occurrence of shoot-through due to premature turn-ON of the previously-OFF MOSFET—independent of the type or size of power MOSFETS coupled to the driver circuit of the present invention.

Figure 3:
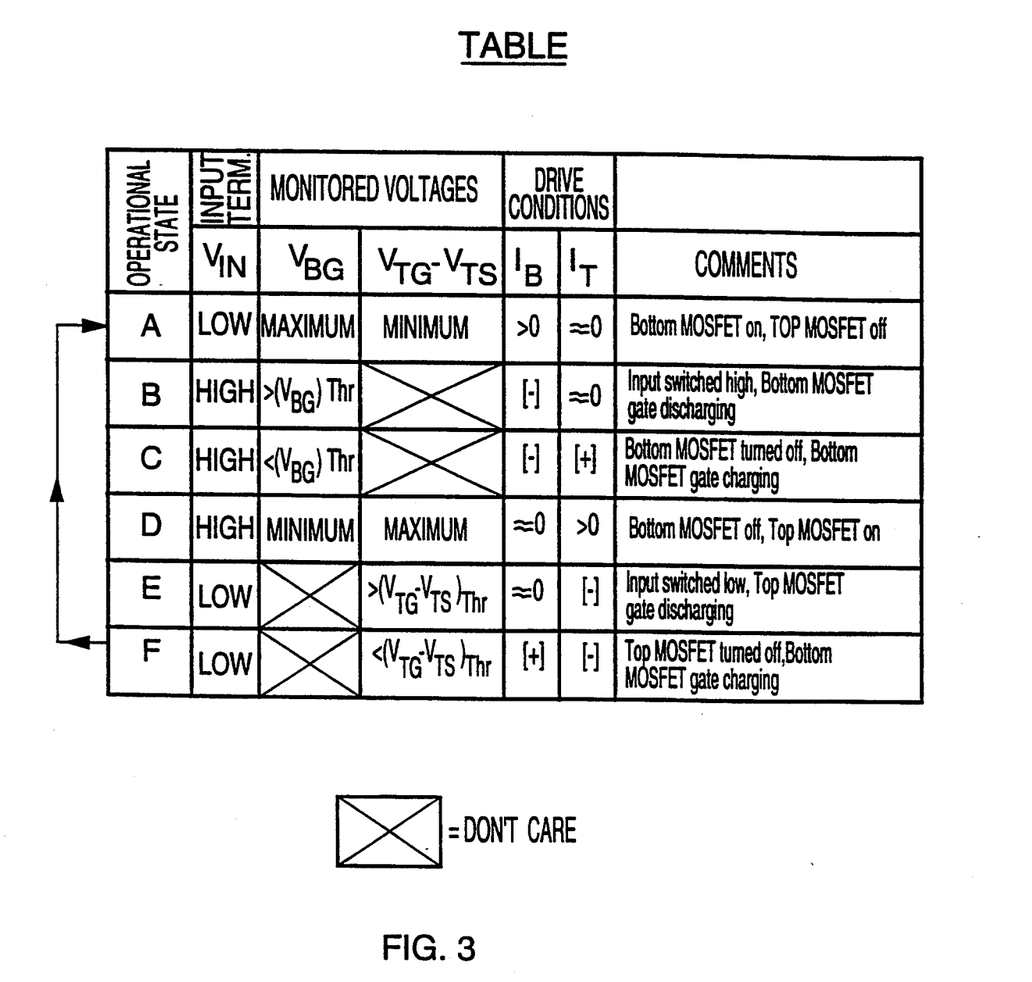
FIG. 3 shows a table which illustrates the shoot-through reduction feature of the present invention.
Figure 4A:
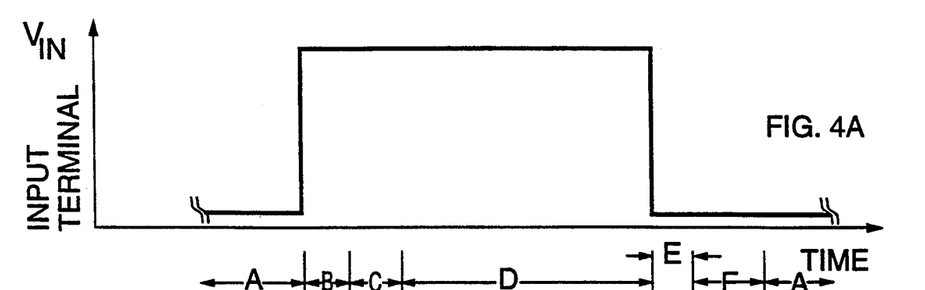
FIGS. 4A-4C show plots of INPUT $V_{IN}$, monitored voltage, and drive conditions versus time, respectively, corresponding to the table of FIG. 3.
Figure 4B:
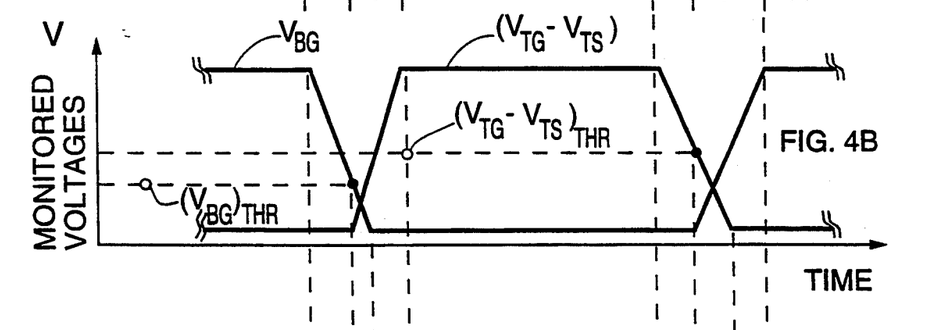
Figure 4C:
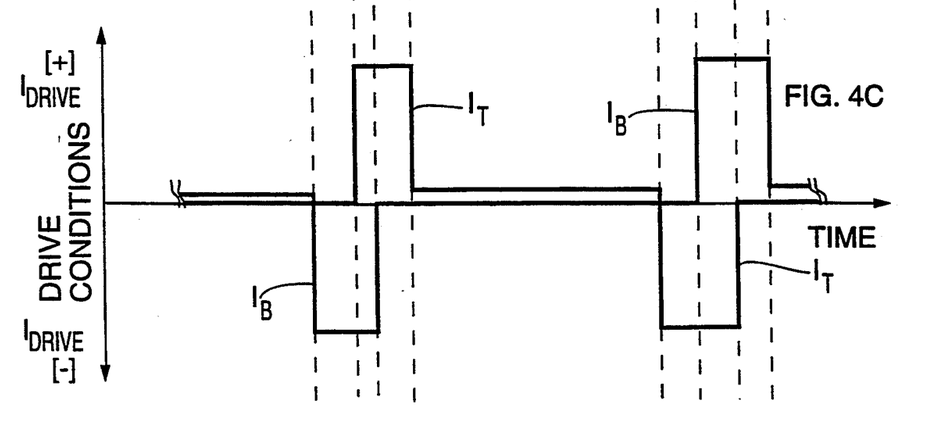

The table of FIG. 3, in conjunction with, FIGS. 4A–4C, illustrate the above shoot-through reduction feature of the present invention. FIGS. 4A–4C show plots of INPUT voltage $V_{IN}$, monitored voltages ($V_{BG}$ and $V_{TG}-V_{TS}$) and drive conditions ($I_B$ and $I_T$) versus time, respectively, corresponding to the table of FIG. 3. Each state A–F shown in the table of FIG. 3, and FIGS. 4A–4C, corresponds to a particular operational state of the driver circuit of the present invention wherein INPUT voltage $V_{IN}$, and the monitored voltages $V_{BG}$ and $V_{TG}-V_{TS}$ take on particular values. In response to these voltages, a driver circuit incorporating the shoot-through reduction feature of the present invention would provide the drive conditions shown as $I_B$ and $I_T$, corresponding to the drive conditions of bottom and top MOSFETS in a half-bridge driver circuit, respectively.

The progression from operational state A to state F corresponds to a progression from a state where the bottom MOSFET is completely ON and the top MOSFET is completely OFF (state A), to where the top MOSFET is completely ON and the bottom MOSFET is completely OFF (state D), and then back again to state A through a state where the bottom MOSFET begins to turn ON (state F). The progression from state A to state F occurs as follows.

As shown in FIGS. 3 and 4A–4C, state A corresponds to when INPUT $V_{IN}$ is LOW, bottom MOSFET 22 is ON (i.e., $V_{BG}$ is at a maximum) and top MOSFET 21 is OFF (i.e., $V_{TG}-V_{TS}$ is at a minimum). In this state, bottom gate drive is ON (i.e., $I_B$ is greater than zero), while top gate drive is OFF (i.e., $I_T$ is approximately zero).

A transition from state A to state B occurs when INPUT $V_{IN}$ goes HIGH. In response, a driver circuit incorporating the shoot-through reduction feature of the present invention would cause the bottom gate drive to sink current (i.e., $I_B$ is negative [−]), so that the bottom MOSFET gate begins to discharge (i.e., $V_{BG}$ decreases) and would simultaneously keep the top gate drive OFF until monitored feedback voltage $V_{BG}$ reaches a predetermined threshold value indicated by $(V_{BG})_{THR}$. When $V_{BG}$ reaches $(V_{BG})_{THR}$, which typically is set at a value where current conduction through the bottom MOSFET is insignificant, a transition to state C occurs.

During state C, top gate drive sources current (i.e., $I_T$ is positive [+]) so that the top MOSFET begins to conduct current (i.e., $V_{TG}-V_{TS}$ begins to increase). Because this state does not occur until $V_{BG}$ of the bottom MOSFET falls below $(V_{BG})_{THR}$, simultaneous current conduction through the top and bottom MOSFETS is prevented. A transition to state D occurs when the top MOSFET is completely ON (i.e., $V_{TG}-V_{TS}$ is at a maximum) and the bottom MOSFET is completely OFF (i.e., $V_{BG}$ is at a minimum).

A transition from state D to state E occurs when INPUT goes LOW. At this point, the top gate drive sinks current (i.e., $I_T$ is negative [−]) so that the top MOSFET begins to stop conducting current (i.e., $V_{TG}-V_{TS}$ begins to decrease). Simultaneously, bottom gate drive is held OFF (i.e., $I_B$ is approximately zero) until $V_{TG}-V_{TS}$ reaches a predetermined threshold value indicated by $(V_{TG}-V_{TS})_{THR}$. When $V_{TG}-V_{TS}$ reaches $(V_{TG}-V_{TS})_{THR}$, which similarly to the bottom MOSFET is typically set at a value where current conduction through the top MOSFET is insignificant, a transition to state F occurs.

During state F, the bottom gate drive sources current (i.e., $I_B$ is positive [+]) so that the bottom MOSFET begins to conduct current (i.e., $V_{BG}$ begins to increase). Because this state does not occur until $V_{TG}-V_{TS}$ of the top MOSFET falls below $(V_{TG}-V_{TS})_{THR}$, simultaneous current conduction through the top and bottom MOSFETS is again prevented, as was the case for corresponding state C.

A transition back to state A, which completes the cycle, occurs when the bottom MOSFET is completely ON (i.e., $V_{BG}$ is at a maximum) and the top MOSFET is completely OFF (i.e., $V_{TG}-V_{TS}$ at a minimum).

In addition to the shoot-through reduction feature of the present invention, which is illustrated by the table of FIG. 3, the present invention also provides for the recharging of a bootstrap capacitor 25 prior to a time when the bootstrap capacitor is needed to turn ON the top MOSFET. This feature of the present invention is provided by first monitoring the output voltage (which corresponds to top MOSFET 21 source voltage $V_{TS}$) after a previously fully-ON top MOSFET is initially turned OFF, and then inhibiting the gate drive to the top MOSFET until the output voltage ($V_{TS}$) has fallen far enough to ensure that the bootstrap capacitor, which is coupled to the output voltage, has sufficient charge to efficiently turn the top MOSFET back ON.

In accordance with this bootstrap recharging feature of the present invention, the gate drive to the top MOSFET is inhibited until the output voltage (i.e., top MOSFET 21 source feedback voltage $V_{TS}$ at terminal 34 in FIG. 2) falls below a predetermined recharge voltage level $(V_{TS})_{RC}$, which is typically set at a voltage value which is a fraction of bias voltage 23. Because the drive to top MOSFET 21 is inhibited until a predetermined voltage condition, the bootstrap capacitor has enough time to recharge so that it will have a sufficient amount of charge to provide adequate turn-ON to top MOSFET 21 when required.

Figure 5:
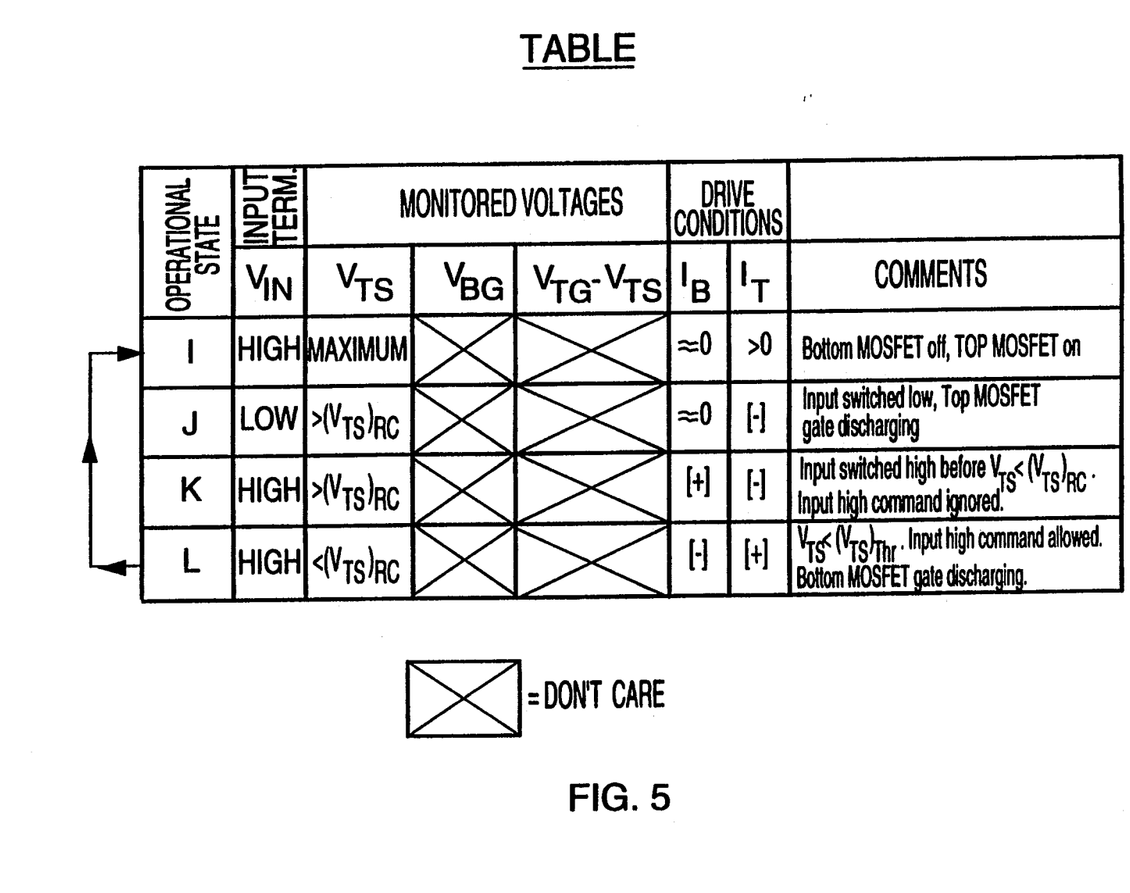
FIG. 5 shows a table which illustrates the bootstrap capacitor recharging feature of the present invention.
Figure 6A:
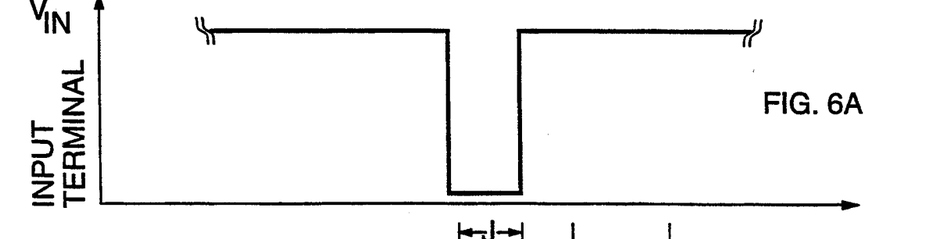
FIGS. 6A-6C show INPUT $V_{IN}$, monitored voltage $V_{TS}$, and drive conditions versus time, respectively, corresponding to the table of FIG. 5.
Figure 6B:
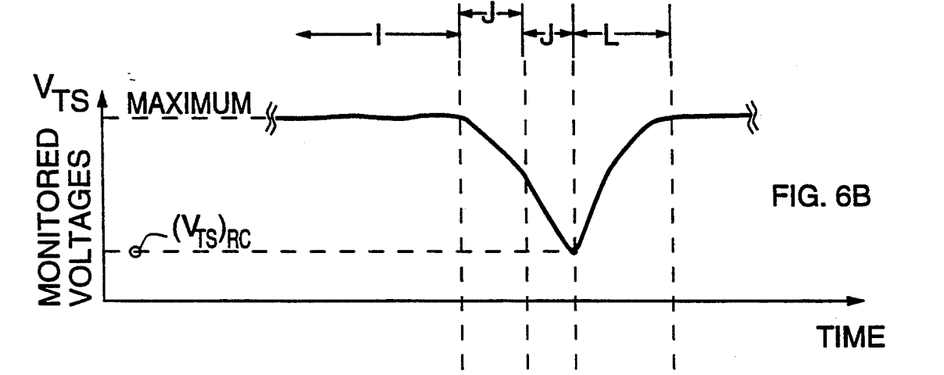
Figure 6C:
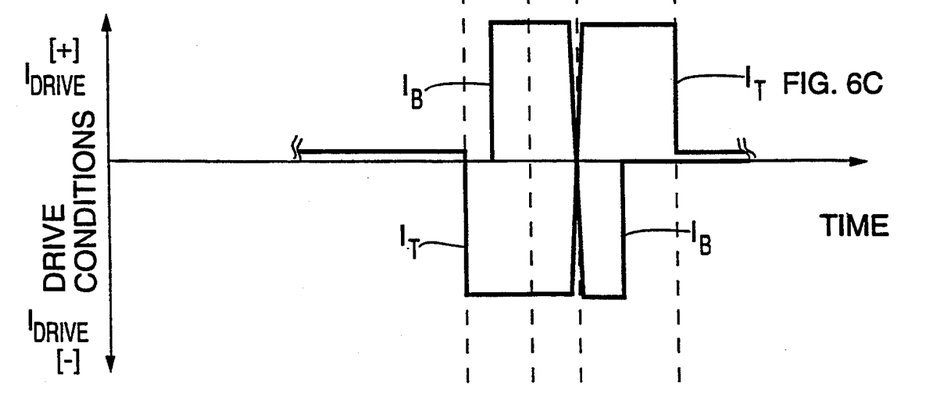

The table of FIG. 5, in conjunction with FIGS. 6A–6C, illustrate the above bootstrap capacitor recharge feature of the present invention. Similar to the table of FIG. 3, each state I–L shown in the table of FIG. 5 corresponds to a particular operational state of the driver circuit of the present invention wherein input voltage $V_{IN}$ and monitored voltage $V_{TS}$ take on particular values. In contrast to the shoot-through reduction feature of the present invention, the bootstrap capacitor recharge feature does not require the monitoring of the gate-to-source voltages of power MOSFETS 21 and 22, [$V_{TG}-V_{TS}$] and [$V_{BG}$], respectively.

In response to $V_{IN}$ and $V_{TS}$, a driver circuit incorporating the bootstrap capacitor recharge feature of the present invention would provide the drive conditions shown in the table of FIG. 5 as $I_B$ and $I_T$, corresponding to the drive conditions of the bottom and top MOSFETS in a half-bridge driver circuit, respectively.

The progression from operational state I to state L corresponds to a progression from a state where the top MOSFET is completely ON and the bottom MOSFET is completely OFF (state I), to a state where INPUT $V_{IN}$ briefly goes LOW (state J), and then to state L where the top MOSFET again turns ON after $V_{TS}$ falls below $(V_{TS})_{RC}$. After proceeding through state L, a driver circuit incorporating the bootstrap capacitor recharge feature of the present invention returns to state I, as shown in FIG. 5. The progression from state I to state L occurs as follows.

As shown in FIGS. 5 and 6A–6C, state I corresponds to when the top MOSFET is completely ON and the bottom MOSFET is completely OFF. During this state, $V_{TS}$ is at a maximum because the top MOSFET is ON.

A transition from state I to state J occurs when INPUT goes LOW. At this point, the top gate drive sinks current (i.e., $I_T$ is negative [−]) so that the top MOSFET begins to stop conducting current (i.e., $V_{TG}-V_{TS}$ begins to decrease). At some time following the INPUT going LOW, the bottom gate drive sources current (i.e., $I_B$ is positive [+]) so that the bottom MOSFET begins to conduct current (i.e., $V_{BG}$ begins to increase). Monitored voltage $V_{TS}$ begins to fall from its maximum value but is at a level greater than $(V_{TS})_{RC}$, the predetermined recharge voltage level.

In accordance with the present invention, a transition to state K occurs when $V_{IN}$ goes high before $V_{TS}$ falls below $(V_{TS})_{RC}$, the predetermined recharge voltage level. A driver incorporating the bootstrap capacitor recharge feature of the present invention would ignore the INPUT HIGH command. Thus, $V_{IN}$ would still be considered LOW, and as a result, the bottom MOSFET will continue to turn ON (i.e., $V_{BG}$ increases). A transition to state L occurs when monitored voltage $V_{TS}$ eventually falls below $(V_{TS})_{RC}$. At that point, the INPUT HIGH command is allowed so that drive to the bottom MOSFET sinks current (i.e., $I_B$ is negative [−]) and drive to the top MOSFET sources current (i.e., $I_T$ is positive [+]). This feature of the present invention facilitates the recharging of bootstrap capacitor 25 so that it will have a sufficient amount of charge to provide adequate drive to gate 21a in order to turn top MOSFET 21 ON—independent of the type or size of power MOSFETS coupled to the driver circuit of the present.

A transition back to state I, which completes the cycle, occurs when the bottom MOSFET is completely OFF and the top MOSFET is completely ON, at which point $V_{TS}$ is at a maximum.

The tables of FIGS. 3 and 5 specifically illustrate the shoot-through reduction and bootstrap capacitor recharge features of the present invention, respectively. However, a driver circuit of the present invention can also incorporate both of these features. The table of FIG. 7 illustrates how a circuit combining these features operates.

Figure 7:
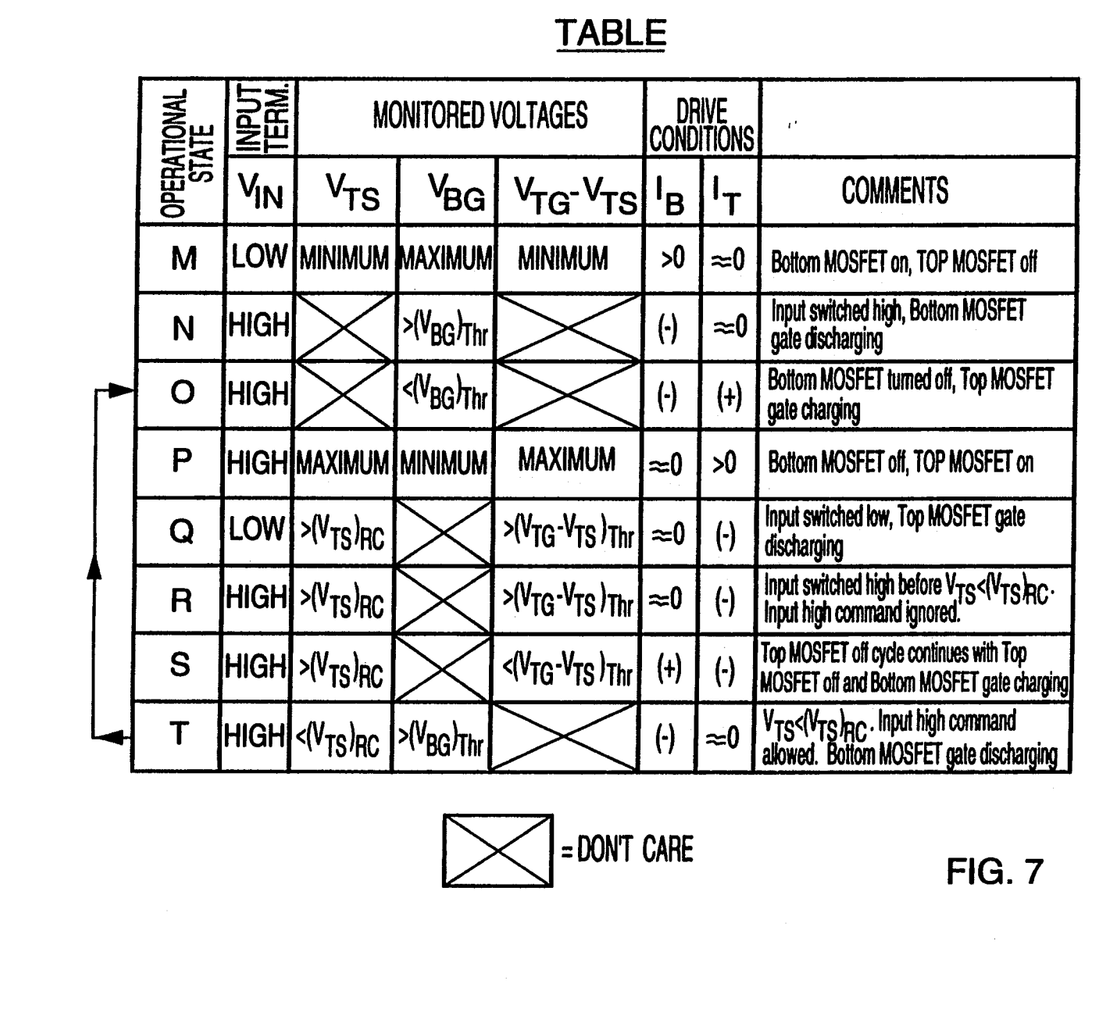
FIG. 7 shows a table which illustrates the combination of the shoot-through reduction and bootstrap capacitor recharging features of the present invention.

As shown in FIG. 7, states M–P correspond to states A–D of FIG. 3 where $V_{IN}$ starts LOW and switches to HIGH wherein shoot-through is prevented by inhibiting the turning ON of the top MOSFET until $V_{BG}$ falls below $(V_{BG})_{THR}$. At state Q in FIG. 7, $V_{IN}$ goes low and both $V_{TS}$ and $(V_{TG}-V_{TS})$ are greater than $(V_{TS})_{RC}$ and $(V_{TG}-V_{TS})_{THR}$, respectively. At state R, $V_{IN}$ goes HIGH before $V_{TS}$ falls below $(V_{TS})_{RC}$ and thus the INPUT HIGH command is ignored, as in state K of FIG. 5. At state S, with $V_{TS}$ still above $(V_{TS})_{RC}$, $(V_{TG}-V_{TS})$ falls below $(V_{TG}-V_{TS})_{THR}$, and thus the bottom MOSFET begins to turn ON, in accordance with state F of FIG. 3. As $V_{TS}$ continues to fall, a transition to state T occurs when $V_{TS}$ falls below $(V_{TS})_{RC}$ while $V_{BG}$ is greater than $(V_{BG})_{THR}$ (keeping the top MOSFET OFF). When $V_{BG}$ falls below $(V_{BG})_{THR}$ a transition back to state O occurs, where the above steps are repeated.

Figure 8:
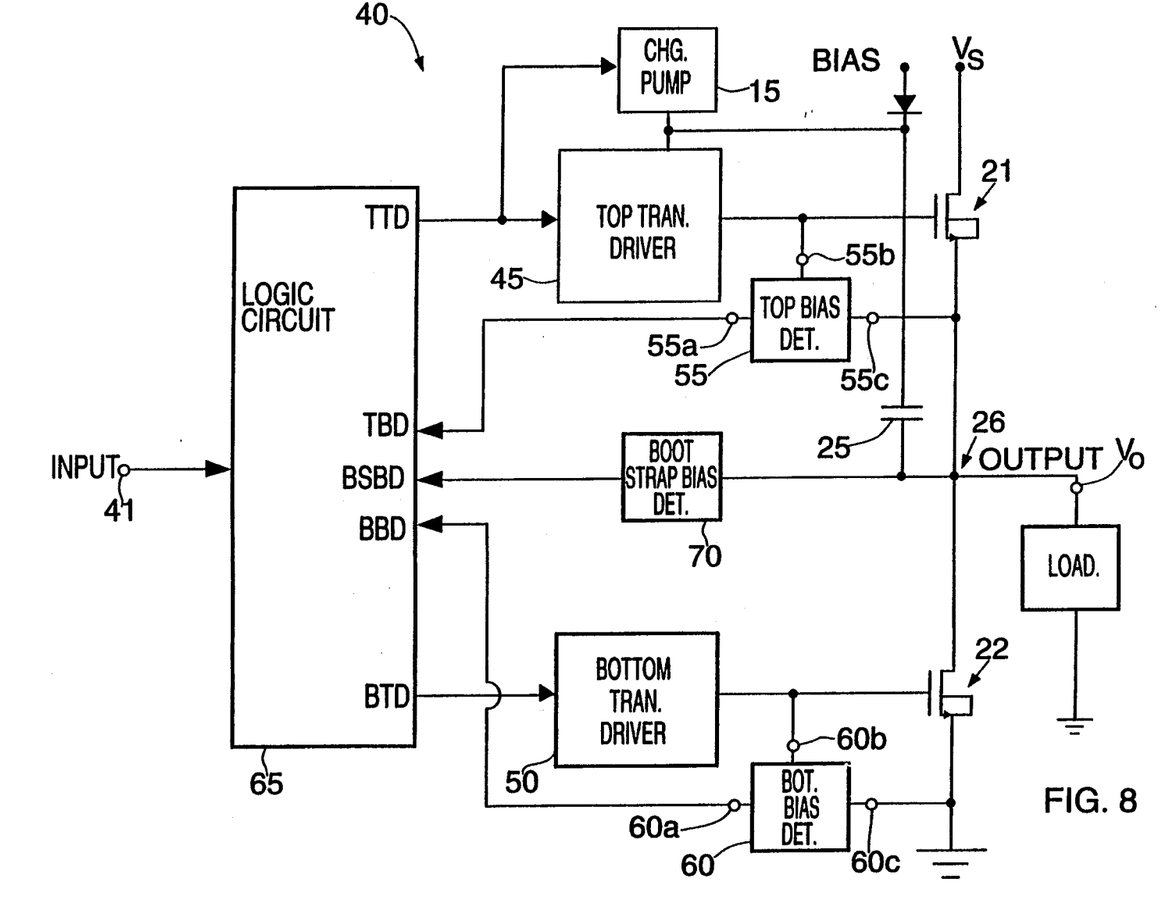
FIG. 8 is a detailed schematic block diagram of an exemplary half-bridge driver circuit incorporating the shoot-through reduction and bootstrap capacitor recharge features of the present invention.

FIG. 8 shows a more detailed schematic block diagram of an exemplary half-bridge driver circuit incorporating both the shoot-through reduction and bootstrap capacitor recharge features of the present invention.

Driver circuit 40 includes logic circuit 65 which is used to monitor MOSFETS 21 and 22 and control their respective drivers 45 and 50 through terminals TTD and BTD, respectively. Terminals TTD and BTD go HIGH when it is desired to turn ON MOSFETS 21 and 22, respectively. Circuit 40 further includes charge pump circuit 15 for providing enhanced voltages to top transistor driver 45 in order to drive MOSFET 21.

In accordance with the present invention, terminals TBD, BBD and BSBD of logic circuit 65 are coupled to top bias detector circuit 55, bottom bias detector circuit 60 and bootstrap bias detector circuit 70, respectively. Circuits 55, 60 and 70 monitor $(V_{TG}-V_{TS})$, $V_{BG}$ and $V_{TS}$, respectively, and generate logic signals which are indicative that these voltages had fallen below the above-discussed predetermined voltage levels $(V_{TG}-V_{TS})_{THR}$, $(V_{BG})_{THR}$ and $(V_{TS})_{RC}$, respectively. These logic signals are supplied to logic circuit 65 through terminals TBD, BBD and BSBD, respectively, and are used to implement the shoot-through reduction and bootstrap capacitor recharge features of the present invention discussed above with respect to FIGS. 2–7.

Figure 9:
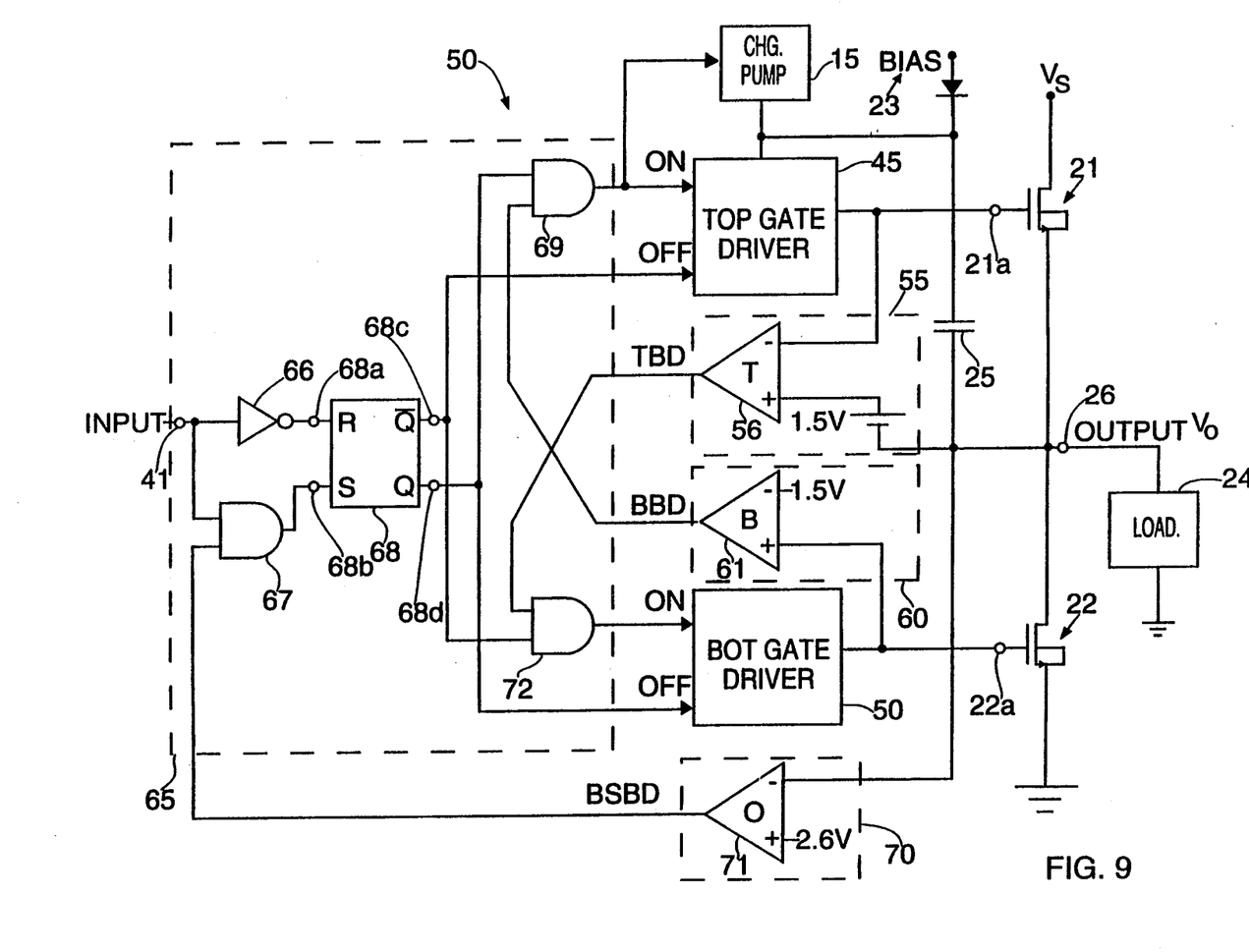
FIG. 9 is a schematic diagram conceptually illustrating exemplary logic used by the half-bridge driver circuit of FIG. 8 operating in accordance with the features illustrated by FIGS. 3-7.

FIG. 9 is a schematic diagram conceptually illustrating exemplary logic used by the half-bridge driver circuit of FIG. 8 operating in accordance with the inventive features illustrated by FIGS. 3–7.

Top bias detector circuit 55, bottom bias detector circuit 60 and bootstrap bias detector circuit 70 are comprised of conventional comparators 56, 61 and 71, respectively. Logic circuit 65 is comprised of inverter 66, AND gates 67, 69 and 72, and RS flip flop 68. Circuit 50 operates as follows.

The input signal polarity on input terminal 41 is such that a high signal causes top power MOSFET 21 to be turned on, while a low signal on input terminal 41 causes bottom power MOSFET 22 to be turned on. If the input had been high and switches low, RS flip-flop 68 is reset by way of reset terminal 68a and Qbar output 68c causes top gate driver 45 to begin turning off top power MOSFET 21. While gate 21a of top power MOSFET 21 is discharging, comparator 56 of top bias detector circuit monitors the gate-to-source voltage on top power MOSFET 21. When the gate to source voltage decreases to 1.5 volts, comparator 56 enables the signal on Qbar terminal 68c to be passed through AND gate 72 so as to allow bottom power MOSFET 22 to be turned on. Since the gate-to-source voltage on top power MOSFET 21 had decreased to below the MOSFET threshold voltage before bottom power MOSFET 22 turns on, so that MOSFET 21 is substantially OFF, shoot-through is reduced or prevented.

Once bottom power MOSFET 22 is conducting, output terminal 26, which is connected to load 24, will be pulled down below 2.6 volts, causing output comparator 71 of bootstrap bias detector circuit 70 to enable input terminal 41 to set RS flip-flop 68 on the next high signal. However, if an input high signal was received before the output went low, it would be ignored until the output voltage $V_0$ falls below 2.6 volts. As discussed above, this feature of the present invention ensures that bootstrap capacitor 25 will have been recharged prior to the next demand for current by top gate driver 45. Once top power MOSFET 21 has been turned on, it can be held on indefinitely by charge pump 15.

A low to high signal transition on input terminal 41, assuming that the output is low, is analogous to the high to low transition described above. In this case, RS flip-flop 68 is set and the Q output at terminal 68d causes bottom gate driver 50 to turn off bottom power MOSFET 22. When the gate to source voltage on bottom power MOSFET 22 has decreased to 1.5 volts, bottom comparator 61 of bottom bias detector circuit 60 enables the Q signal on terminal 68d to pass through AND gate 69 to top gate driver 45 so as to allow top power MOSFET 21 and charge pump 15 to be turned on. Again, by ensuring that the gate to source voltage on bottom power MOSFET 22 has dropped below 1.5 volts before top power MOSFET 21 is turned on, shoot-through is reduced or prevented.

It will be apparent that although the present invention has been discussed with reference to FIGS. 2–9, wherein the power transistors were both n-channel MOSFETS, the present invention is applicable to other types of transistor pairs, for example, a pair of p-channel MOSFETS, a pair of complementary MOSFETS (i.e., one p-channel and one n-channel), a pair of insulated-gate bipolar transistors or pairs of other types of bipolar transistors.

It will also be apparent that although FIGS. 8 and 9 show particular embodiments of a driver circuit incorporating the shoot-through reduction and bootstrap capacitor recharge features of the present invention illustrated by FIGS. 2–7, many other implementations are also possible.

For example, although FIG. 9 shows INPUT terminal 41 and the "ON" and "OFF" signals of drivers 45 and 50 as "voltage" signals, these signals could just as well be "current" signals. Additionally, although FIG. 9 shows inverter 66, AND gate 67 and RS flip-flop 68 as individual components, the driver circuit could just as well include a network of components which implements functionally the same or equivalent logic. For example, these three particular components and their associated functions could be replaced by a single indivisible network of transistors which accept as an input signal a current instead of a voltage signal, and which also supply to drivers 45, 50 current signals equivalent to the voltage signals supplied by the Q and Qbar outputs of RS flip-flop 68 and AND gates 69, 72 shown in FIG. 9. It will be apparent that many other equivalent modifications to the particular embodiment of the driver circuit of the present invention shown in FIG. 9 could as well be made.

Thus, a driver circuit capable of preventing shoot-through and the problems associated with driving the top power transistor in a half-bridge configuration under non-optimum conditions has been provided.

One skilled in the art will thus appreciate that the present invention can be practiced by other than the described embodiments, which are presented for purposes of illustration and not of limitation, and the present invention is limited only by the claims which follow.

What is claimed is:

1. A circuit for alternately driving first and second transistors, each transistor having a control terminal for receiving a transistor drive signal, at least one of said transistor having a terminal coupled to an output terminal adapted to be coupled to a load and to a bootstrap capacitor charged to provide a boosted drive voltage to the first transistor, said circuit comprising:

a driver input adapted for receiving a driver input signal having a first state intended to turn the first transistor ON and the second transistor OFF, and a second state intended to turn the first transistor OFF and the second transistor ON;

means for monitoring the first transistor to generate a first signal indicative of the first transistor being in an operational state that can be considered substantially OFF;

means for monitoring the second transistor to generate a second signal indicative of the second transistor being in an operational state that can be considered substantially OFF;

means for monitoring the voltage at the output terminal to generate a recharge signal when the output voltage is below a predetermined voltage level; and means coupled to the control terminals of the first and second transistors for driving the transistors in response to the driver input signal, the recharge signal and the first and second signals, so that (1) the first transistor is prevented from being driven ON until the driver input signal is in the first state and the second and recharge signals are also present, and (2) the second transistor is prevented from being driven ON until the driver input signal is in the second state and the first signal is also present, whereby the drive to the first transistor is inhibited until the second transistor is considered to be substantially OFF and the bootstrap capacitor has had time to charge sufficiently to provide at least a predetermined boost to the first transistor drive voltage, and the drive to the second transistor is inhibited until the first transistor is considered to be substantially OFF.

2. The circuit of claim 1, wherein the first and second transistors are field effect transistors, each having a gate terminal as the control terminal, and an associated gate-to-source voltage.

3. The circuit of claim 2, wherein the first and second transistors are n-channel field effect transistors.

4. The circuit of claim 2, wherein the first transistor comprises a p-channel field effect transistor and the second transistor comprises a n-channel field effect transistor.

5. The circuit of claim 2, wherein:

the first transistor monitoring means monitors the first transistor gate-to-source voltage to generate the first signal when the magnitude of the first transistor gate-to-source voltage is less than a first threshold voltage; and the second transistor monitoring means monitors the second transistor gate-to-source voltage to generate the second signal when the magnitude of the second transistor gate-to-source voltage is less than a second threshold voltage.

6. The circuit of claim 5, wherein:
the first threshold voltage is at or less than approximately the intrinsic threshold voltage of the first transistor; and
the second threshold voltage is at or less than approximately the intrinsic threshold voltage of the second transistor.

7. The circuit of claim 5, wherein:
the first threshold voltage is at or less than approximately 2 volts; and
the second threshold voltage is at or less than approximately 2 volts.

8. The circuit of claim 7, wherein the first transistor monitoring means and the second transistor monitoring means are comparators.

9. The circuit of claim 7, where said driving means further includes a supply terminal coupled to a charge ramp means for providing enhanced voltage drive to the first transistor.

10. The circuit of claim 2 wherein the predetermined voltage is chosen to ensure that the first transistor is driven by a voltage boosted sufficiently beyond the voltage at the first transistor first terminal to reduce operation of the first transistor under non-optimal bias conditions.

11. The circuit of claim 2, wherein the predetermined voltage level is at or less than approximately 3 volts.

12. The circuit of claim 11, wherein the monitoring means comprises a comparator.

13. A circuit for alternately driving first and second transistors, each transistor having a control terminal for receiving a transistor drive signal, at least one of said transistors having a terminal coupled to an output terminal adapted to be coupled to a load and to a bootstrap capacitor charged to provide a boosted drive voltage to the first transistor, said circuit adapted for receiving a driver input signal having a first state intended to turn the first transistor ON and the second transistor OFF, and a second state intended to turn the first transistor OFF and the second transistor ON, said circuit comprising:
means for generating a first signal responsive to a determination that the first transistor has entered an operational state that can be considered substantially OFF;
means for generating a second signal responsive to a determination that the second transistor has entered an operational state that can be considered substantially OFF; and
means for generating a recharge signal indicative of the bootstrap capacitor having charged sufficiently to provide at least a predetermined boost to the first transistor drive voltage; and
means coupled to the control terminals of the first and second transistors for driving the transistors in response to the driver input signal, the recharge signal and the first and second signals, so that (1) the first transistor is prevented from being driven ON until the driver input signal is in the first state and the second and recharge signals are also present, and (2) the second transistor is prevented from being driven ON until the driver input signal is in the second state and the first signal is also present,
whereby the drive to the first transistor is inhibited until the second transistor is considered to be substantially OFF and the bootstrap capacitor has had time to sufficiently charge, and the drive to the second transistor is inhibited until the first transistor is considered to be substantially OFF.

14. A method for alternately driving first and second transistors, each transistor having a control terminal for receiving a transistor drive signal, at least one of said transistors having a terminal coupled to an output terminal adapted to be coupled to a load and to a bootstrap capacitor charged to provide a boosted drive voltage to the first transistor, said circuit adapted for receiving a driver input signal having a first state intended to turn the first transistor ON and the second transistor OFF, and a second state intended to turn the first transistor OFF and the second transistor ON, said method comprising the steps of:
detecting when the first transistor has entered an operational state that can be considered substantially OFF to responsively generate a first signal;
detecting when the second transistor has entered an operational state that can be considered substantially OFF to responsively generate a second signal; and
generating a recharge signal indicative of the bootstrap capacitor having charged sufficiently to provide at least a predetermined boost to the first transistor drive voltage; and
driving the transistors in response to the driver input signal, the recharge signal and the first and second signals, so that (1) the first transistor is prevented from being driven ON until the driver input signal is in the first state and the second and recharge signals are also present, and (2) the second transistor is prevented from being driven ON until the driver input signal is in the second state and the first signal is also present,
whereby the drive to the first transistor is inhibited until the second transistor is considered to be substantially OFF and the bootstrap capacitor has had time to sufficiently charge, and the drive to the second transistor is inhibited until the first transistor is considered to be substantially OFF.

15. A circuit for alternately driving first and second transistors, each transistor having a control terminal for receiving a transistor drive signal, at least one of said transistors having a terminal coupled to an output terminal adapted to be coupled to a load and to a bootstrap capacitor charged to provide a boosted drive voltage to the first transistor, said circuit comprising:
a driver input adapted for receiving a driver input signal having a first state intended to turn the first transistor ON and the second transistor OFF, and a second state intended to turn the first transistor OFF and the second transistor ON;
means for monitoring one of the first and second transistors to generate an "OFF" signal indicative of the monitored transistor being in an operational state that can be considered substantially OFF;
means for generating a recharge signal indicative of the bootstrap capacitor having charged sufficiently to provide at least a predetermined boost to the first transistor drive voltage; and
means coupled to the control terminals of the first and second transistors for driving the transistors in response to the driver input signal, and to the "OFF" and recharge signals, so that:
(1) if the second transistor is monitored, the first transistor is prevented from being driven ON until the driver input signal is in the first state, and the recharge and "OFF" signals are also present; or (2) if the first transistor is monitored, (a) the second transistor is prevented from being driven ON until the driver input signal is in the second state and the "OFF" signal is also present, and (b) the first transistor is prevented from being driven ON until the driver input signal is in the first state and the recharge signal is also present, whereby the efficiency of the circuit is improved.

16. The circuit of claim 15, wherein the first transistor is monitored.

17. The circuit of claim 15, wherein the second transistor is monitored.

18. The circuit of claim 2, wherein the first and second transistors are stacked in series between two supply terminals and each transistor has a first terminal coupled to a different one of the supply terminals and a second terminal commonly coupled to the output terminal.

19. The circuit of claim 5, wherein the first and second transistors are stacked in series between two supply terminals and each transistor has a first terminal coupled to a different one of the supply terminals and a second terminal commonly coupled to the output terminal.

20. The circuit of claim 9, wherein the first and second transistors are stacked in series between two supply terminals and each transistor has a first terminal coupled to a different one of the supply terminals and a second terminal commonly coupled to the output terminal.

21. The circuit of claim 13, wherein the first and second transistors are stacked in series between two supply terminals and each transistor has a first terminal coupled to a different one of the supply terminals and a second terminal commonly coupled to the output terminal.

22. The method of claim 14, wherein the first and second transistors are stacked in series between two supply terminals and each transistor has a first terminal coupled to a different one of the supply terminals and a second terminal commonly coupled to the output terminal.

* * * * *

UNITED STATES PATENT AND TRADEMARK OFFICE
CERTIFICATE OF CORRECTION

PATENT NO. : 5,365,118
DATED : November 15, 1994
INVENTOR(S) : Milton E. Wilcox

It is certified that error appears in the above-indentified patent and that said Letters Patent is hereby corrected as shown below:

| Column | Line | |
|--------|------|---|
| 6 | 34 | after "$V_{ts}$", insert -- is -- |
| 10 | 12 | "transistor", should be -- transistors -- |
| 11 | 21 | "ramp", should be -- pump -- |
| 11 | 24 | after "Voltage", insert -- level -- |

Signed and Sealed this

Twenty-seventh Day of June, 1995

Attest:

BRUCE LEHMAN

Attesting Officer

Commissioner of Patents and Trademarks